United States Patent
Buckley et al.

(10) Patent No.: US 7,000,173 B2
(45) Date of Patent: Feb. 14, 2006

(54) TURBO CODE BASED INCREMENTAL REDUNDANCY

(75) Inventors: Michael E. Buckley, Gurnee, IL (US); Raja S. Bachu, Waukegan, IL (US); Amitava Ghosh, Buffalo Grove, IL (US); Rapeepat Ratasuk, Wilmette, IL (US); Kenneth A. Stewart, Grayslake, IL (US); Mathieu Villion, Toulouse (FR)

(73) Assignee: Motorola, Inc., Schaumburg, IL (US)

( * ) Notice: Subject to any disclaimer, the term of this patent is extended or adjusted under 35 U.S.C. 154(b) by 354 days.

(21) Appl. No.: 10/074,115

(22) Filed: Feb. 11, 2002

(65) Prior Publication Data

US 2003/0159100 A1    Aug. 21, 2003

(51) Int. Cl.
    *H03M 13/03*    (2006.01)
(52) U.S. Cl. .................................. 714/790; 714/786
(58) Field of Classification Search ............. 714/786, 714/790, 751
See application file for complete search history.

(56) References Cited

U.S. PATENT DOCUMENTS

| | | | |
|---|---|---|---|
| 6,370,669 B1 * | 4/2002 | Eroz et al. | 714/774 |
| 6,697,986 B2 * | 2/2004 | Kim et al. | 714/751 |
| 6,738,370 B2 * | 5/2004 | Ostman | 370/349 |
| 2002/0009157 A1 | 1/2002 | Sipola | |

OTHER PUBLICATIONS

Chandran, N. et al. "Hybrid ARQ Using Serial Concatenated Convolutional Codes Over Fading Channels." *IEEE* 2001, pp. 1410-1414.

3GPP TR 25.858 v1.0.4 (Jan. 2002), 3$^{rd}$ Generation Partnership Project: Technical Specification Group Radio Access Network; High Speed Downlink Packet Access; Physical Layer Aspects (Release 5).

3GPP TS 25.212 v3.5.0 (Dec. 2000), 3$^{rd}$ Generation Partnership Project: Technical Specification Group Radio Access Network; Multiplexing and channel coding (FDD) (Release 1999).

* cited by examiner

*Primary Examiner*—Joseph D. Torres
(74) *Attorney, Agent, or Firm*—Brian M. Mancini; Matthew C. Loppnow

(57) ABSTRACT

An improved turbo code based incremental redundancy includes a first step of puncturing a data stream for a first transmission to provide a set of first unpunctured trellis sections. A next step includes puncturing a data stream for a second transmission to provide a set of second unpunctured trellis sections. A next step includes incremental redundancy combining the first and second transmissions of the trellises to provide non-adjacent first and second unpunctured trellis sections. The above arrangement results in a uniform distribution of punctured and unpunctured bits to provide lower errors.

18 Claims, 6 Drawing Sheets

— PRIOR ART —

— PRIOR ART —

PARITY 1 TRELLIS FOR 1ST TRANSMISSION
s=1,r=0

PARITY 1 TRELLIS FOR 2ND TRANSMISSION      +
s=1,r=1

PARITY 1 TRELLIS AFTER IR COMBINING      ↓

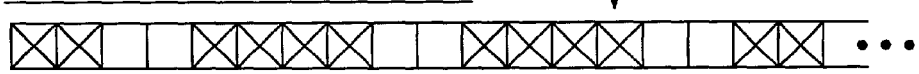

☒ PUNCTURED TRELLIS SECTION    ☐ UNPUNCTURED TRELLIS SECTION

— PRIOR ART —

FIG. 5

PARITY 1 TRELLIS FOR 1ST TRANSMISSION
s=1,r=0

PARITY 1 TRELLIS FOR 2ND TRANSMISSION      +
s=1,r=1

PARITY 1 TRELLIS AFTER IR COMBINING      ↓

☒ PUNCTURED TRELLIS SECTION    ☐ UNPUNCTURED TRELLIS SECTION

FIG. 6

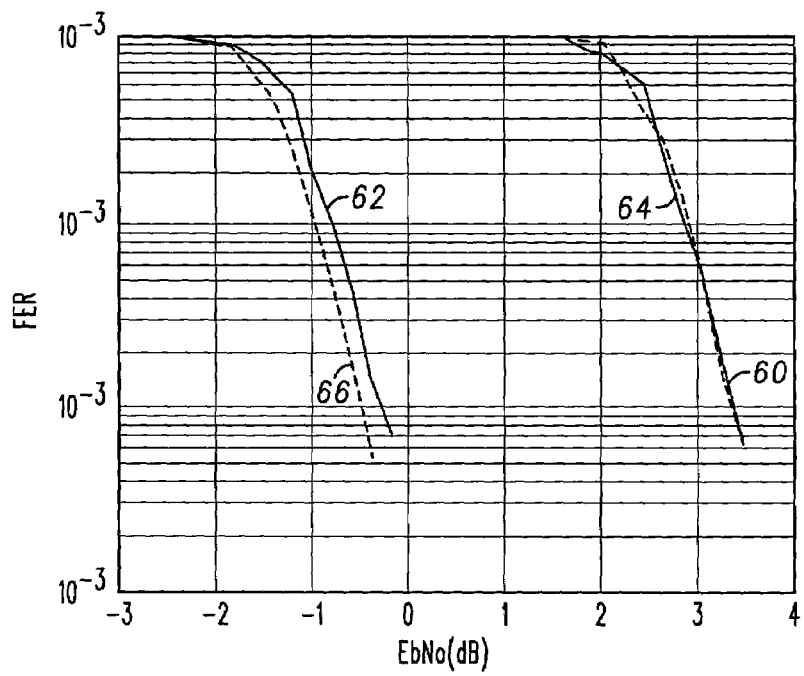
FIG. 7
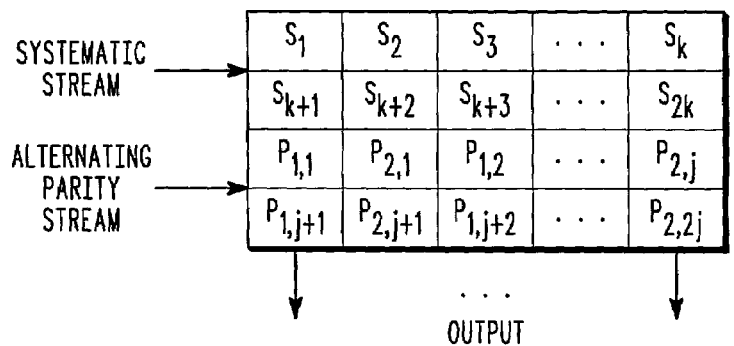
FIG. 8
$$\begin{bmatrix} y_{p,1} & y_{p,2} & y_{p,3} & y_{p,30} \\ y_{p,(30+1)} & y_{p,(30+2)} & y_{p,(30+3)} & y_{p,(2\times30)} \\ \vdots & \vdots & \vdots & \vdots \\ y_{p,(16-1)\times30+1} & y_{p,(16-1)\times30+2} & y_{p,(16-1)\times30+3} & y_{p,(16\times30)} \end{bmatrix}$$
FIG. 9

TURBO CODE BASED INCREMENTAL REDUNDANCY

FIELD OF THE INVENTION

This invention relates generally to communication systems, and more particularly to coding in a turbo coded communication system.

BACKGROUND OF THE INVENTION

Convolutional codes are often used in digital communication systems to protect transmitted information from error. Such communication systems include the Direct Sequence Code Division Multiple Access (DS-CDMA) standard IS-95, the Global System for Mobile Communications (GSM), and next generation wideband communication systems. Typically in these systems, a signal is convolutionally coded into an outgoing code vector that is transmitted. At a receiver, a decoder, such as a Viterbi decoder as is known in the art, uses a trellis structure to perform an optimum search for the transmitted signal bits based on maximum likelihood criterion.

More recently, turbo codes have been developed that outperform conventional coding techniques. Turbo codes are generally composed of two or more recursive systematic convolutional codes and turbo interleavers. Correspondingly, turbo decoding is iterative and uses a soft output decoder to decode the individual convolutional codes. The soft outputs of the decoders are used in the decoding procedure to iteratively approach the converged final results.

FIG. 1 shows an overview of typical turbo encoder that is constructed with one interleaver and two constituent codes, which are recursive systematic convolutional (RSC) codes, but can be block codes, also. A turbo encoder is shown which is a parallel concatenation of two RSCs with an interleaver, $\pi$, between them. The output of the turbo encoder is generated by multiplexing (concatenating) the systematic information bits, $x_s$, and parity bits, $p_1$ and $p_2$, from the two encoders. Typically, the parity bits are punctured in some manner for the first transmission and combined to increase code rate. The puncturing mechanism occurs in the Rate Matching block. In the case subsequent transmissions are allowed and transmissions with different puncturings can be combined at the receiver, puncturing may also be preformed on the systematic bits.

Typically, the encoded data is transmitted to a receiver, which uses error correction typically provided by the turbo code, followed by error detection typically provided by a CRC code. If an error is detected, the receiver can request that the transmitter, such as a base station for example, retransmit the data using an Automatic Repeat Request (ARQ). In other words, if a receiver is not able to resolve the data bits in time, the radio can request the transmitter to resend either an identical transmission as the first, or one punctured different from the first transmission but encoded based on same message (i.e. based on the same information bit sequence input to the turbo encoder). Since this process is a hybrid form of error correction coupled with error detection feedback through the ARQ mechanism it is commonly referred to as Hybrid Automatic Repeat Request (HARQ).

Two known forms of HARQ are Chase combining and Incremental Redundancy (IR). In addition, the IR scheme can be full or partial. Chase combining is a simplified form of HARQ wherein the receiver simply requests retransmission of the original codeword again. IR is more complicated in that it provides for a retransmission of the code word using more or different parity bits (than were present during the previous transmission), lowering the overall combined code rate. A repetition or puncturing pattern in the parity bits can be defined using a classical code puncturing matrix, as is known in the art, or a rate matching algorithm to maintain the code rate of the physical channel. However, previous rate matching algorithms do not maintain a homogenous puncturing pattern after incremental redundancy even if orthogonality is retained (i.e. even if each transmission contains unique bits not contained in other transmissions), thereby presenting a higher than necessary frame error rate (FER). In particular, existing rate matching algorithms provide differing error degradations depending on the redundancy version being used. Moreover, there is no method for determining redundancy parameters for HARQ.

What is needed is an improved turbo coder that utilizes a unified puncturing scheme, which provides an improved frame error rate using an incremental redundancy technique whereby orthogonal redundancy versions are available for transmission, the combination of which result in an uniform puncturing pattern throughout the decoder trellis. It would also be advantageous to provide this improvement using any of the available redundancy versions. It would also be of benefit, to provide a technique for determining redundancy parameters to provide a turbo coder with minimized computational complexity.

BRIEF DESCRIPTION OF THE DRAWINGS

The features of the present invention, which are believed to be novel, are set forth with particularity in the appended claims. The invention, together with further objects and advantages thereof, may best be understood by reference to the following description, taken in conjunction with the accompanying drawings, in the several figures of which like reference numerals identify like elements, and in which:

FIG. 5 shows simplified graphic representation for prior art puncturing;

FIG. 6 shows simplified graphic representation for puncturing, in accordance with the present invention;

FIG. 7 shows a graphical representation of the improvement provided by the present invention;

FIG. 8 shows a chart for bit priority mapping, in accordance with the present invention;

FIG. 9 shows a chart for block interleaver management, in accordance with the present invention;

DETAILED DESCRIPTION OF THE PREFERRED EMBODIMENT

Figure 1:
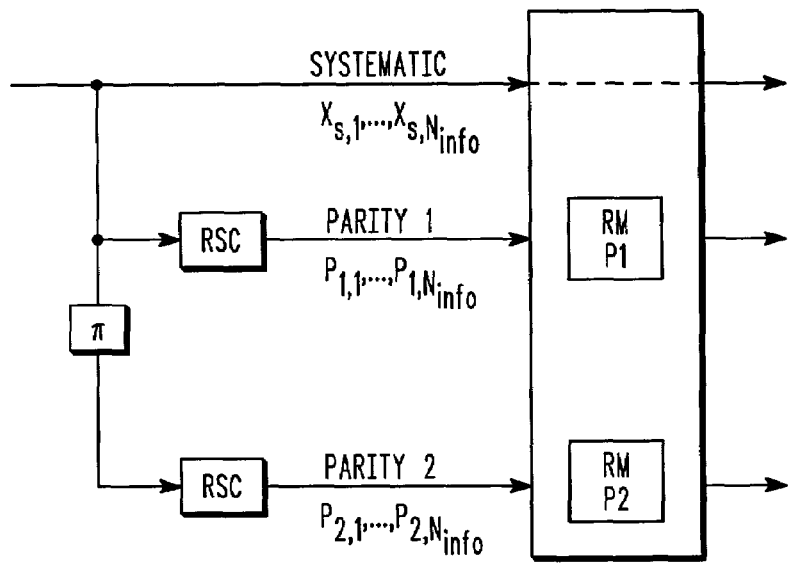
FIG. 1 shows a simplified block diagram for a turbo encoder as is known in the prior art.

The present invention provides a method and apparatus for a turbo coder that supports Chase and incremental redundancy (IR) as a form of ARQ combining, using a single, unified puncturing scheme. In particular, the present invention uses an improved rate-matching technique for puncturing. The nature of the rate matching ensures a regular puncturing distributed throughout the encoded trellis ensuring good code performance. The puncturing approach of the present invention has the advantage of ease of implementation as well as retaining the orthogonality in adapting to any selected redundancy version without an increase in frame errors.

In application, The High Speed Downlink Packet Access (HSDPA) feature of the Third Generation Partnership Project (3GPP) UTRA (UMTS Terrestrial Radio Access) or Wideband Code Division Multiple Access (WCDMA) system features adaptive modulation and coding and details a hybrid-ARQ scheme based on Incremental Redundancy (IR) methods applied to a rate-1/3 turbo-code. The present invention defines the High Speed Downlink Shared Channel (HS-DSCH) coding modulation using incremental redundancy in user equipment (UE), such as a cellular radio communication device. The present invention describes a specific method for applying IR to HSDPA.

IR methods are known in the art, and have been applied before to systems such as Enhanced Data for GSM Evaluation (EDGE). However, the HSDPA problem is novel, in that, all possible coding rates must be supported and only under certain conditions such as in some cases, retransmissions of equal size, is there the potential for orthogonal transmissions. Moreover, the present invention allows for a change in the final coding rate according to the available coded symbol memory or Soft Metric Locations (SMLs) available to the HARQ process. Also, unlike the present invention, prior systems, such as EDGE, utilized convolutional codes rather than turbo codes, and supported a different number of redundancy versions.

The present invention provides a flexible IR puncturing scheme specifically applicable to HSDPA. In particular, the puncturing scheme of the present invention supports a variable set of possible redundancy versions using a novel implementation of a rate-matching puncturing technique. Prior art implementations for rate-matching, while providing orthogonal puncturing patterns in the individual parity bit streams, do not result in a uniformly patterned (and orthogonal) puncturing scheme in the composite of the parity transmissions. This results in increased FER for the different redundancy version used. The present invention accounts for these problems by retaining orthogonality between redundancy versions and provides uniform spacing (i.e. equally spaced unpunctured trellis sections) throughout the composite IR combined trellis. This can include puncturing of parity and systematic bits. Moreover, the present invention provides a method of selecting redundancy parameters as will be described below.

Figure 2:
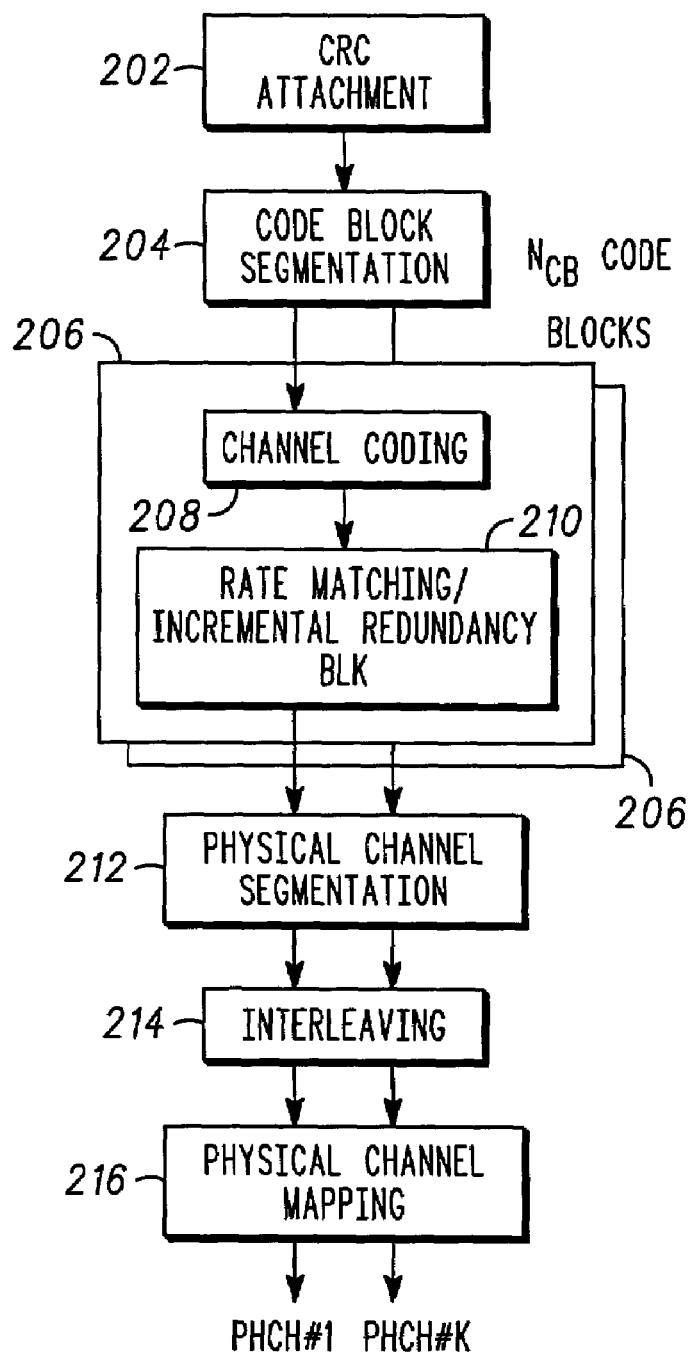
FIG. 2 shows a simplified flow chart for a prior art coding structure.

FIG. 2 shows the existing reference channel coding model for High Speed Downlink Packet Access (HSDPA) in accordance with the 3GPP specification protocols of section 4.2, "Technical Specification Group Radio Access Network; Multiplexing and Channel Coding (FDD) (Release 1999)", TS 25.212 v3.5.0 (2000-12), which is hereby incorporated by reference. Data is input from a single transport block. To this stream, cyclic redundancy check (CRC) is added 202, and then the stream is segmented 204 to produce $N_{CB}$ code blocks 206. The detailed functionality of these blocks 200–206 is presented in TS 25.212. At this point, each of the code blocks are individually subjected to channel coding 208 and rate matching 210 according to the puncturing and incremental redundancy used. The blocks are then subject to physical channel segmentation 212, interleaving 214, and physical channel mapping 216, where physical channels 1 through K are output.

Figure 4:
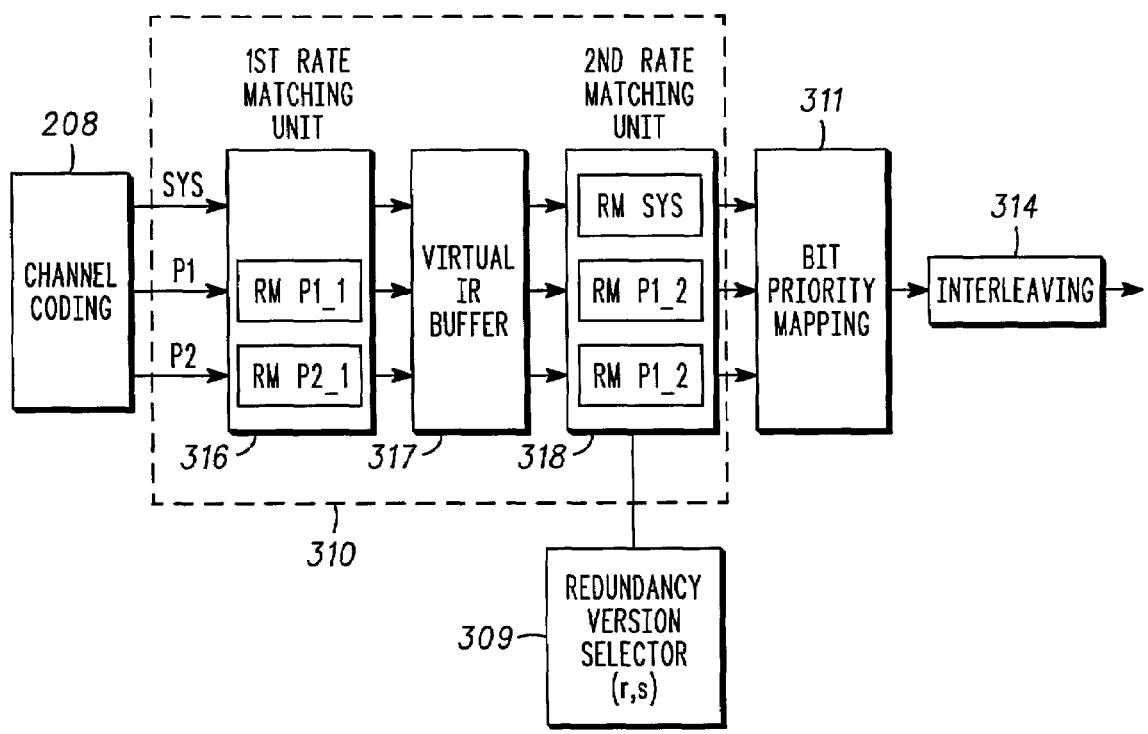
FIG. 4 shows a simplified block diagram for the rate matching of FIG. 3.
Figure 3:
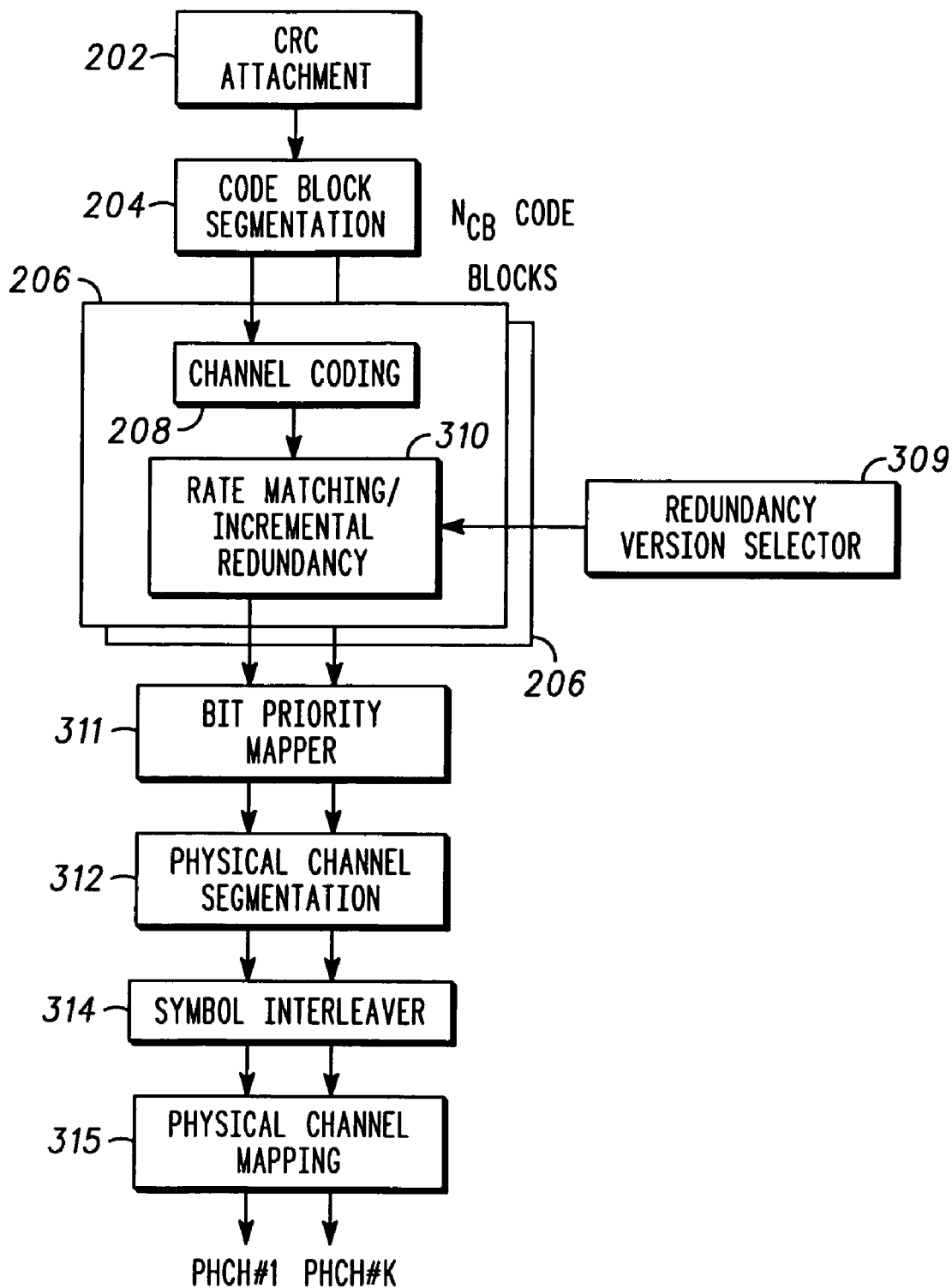
FIG. 3 shows a simplified flow chart for a coding apparatus, in accordance with the present invention.

FIG. 3 shows a channel coding model for the HSDPA turbo coder in accordance with the present invention. The first four operations (transport block concatenation 200, CRC attachment 202, code block segmentation 204, and channel coding 208) proceed according to the 3GPP protocols previously described. Preferably, channel coding 208 proceeds according to a channel coder operable to code an input data stream into systematic bits and parity bits at a rate-1/3 turbo encoding function. In addition, the last three stages (physical channel segmentation 312, (symbol) interleaver 314, and physical channel mapping 315) also proceed similarly to the 3GPP protocols with the exception of operation on symbols instead of bits. The present invention occurs in the redundancy version selector 309, rate matching/incremental redundancy block 310, and the optional bit priority mapper/interleaver 311, as detailed in FIG. 4.

The functionality of HARQ uses two rate-matching stages. The matching block 310 matches the number of bits at the output of the channel coder 208 to the total number of bits of the HS-DSCH physical channels through puncturing or repeating incoming systematic, parity 1 and parity 2 bits, and is controlled by the redundancy version (RV). The rate matching algorithm is applied differently to different set of systematic and parity inputs bits, depending on the parameters of the redundancy version. The rate matching block 310 punctures a data stream (that can include parity and systematic bits) for a first transmission to provide a set of first unpunctured trellis sections and punctures a data stream. A redundancy version selector 309 is coupled to the rate matching block 310 and provides rate-matching parameters thereto. The rate matching block 310 provides incremental redundancy to combine the first and second transmissions of the data stream trellises to provide non-adjacent first and second unpunctured trellis sections.

The first rate-matching stage 316 matches the number of input bits to the number of soft bits available at the user equipment. If the number of soft bits available at the user equipment is greater than or equal to the number of bits output from the channel encoder 208 then all the bits can be stored and the first rate-matching stage is transparent. However, if the number of soft bits available at the user equipment is less than the number of bits output from the channel encoder 208, as is typical, then puncturing occurs so that the number of encoder output bits matches the available soft-buffering capability of the user equipment, represented by buffer stage 317.

The second rate-matching stage 318 matches the number of bits output from the first rate-matching stage 316 to the number of bits available in the HS-DSCH physical channel. The same basic technique is used as for the first rate-matching stage. However, compared to first stage rate matching, the rate-matching algorithm may use different values for the rate-matching parameters, depending on the RV parameters: s, which can take the value 0 or 1 to distinguish self-decodable (1) and non self-decodable (0) transmissions, and the RV parameter r (range 0 to $r_{max}$, which is the maximum number of redundancy versions supported by the communication system) which changes the initial error variable $e_{ini}$.

For example, the number of bits before second rate matching can be denoted as $N_{sys}$ for the systematic bits, $N_{p1}$ for the parity 1 bits, and $N_{p2}$ for the parity 2 bits, respectively. The number of available physical channel bits per transmit time interval (TTI) is $N_{data}$. Bit separation is used and the rate matching parameters are determined as follows. For $N_{data} \leq N_{sys} + N_{p1} + N_{p2}$, puncturing is performed in the second rate matching stage 318. The number of transmitted systematic bits in a retransmission is $$N_{t,sys}=\min\{N_{sys},N_{data}\}$$

for a transmission of self-decodable type (s=1) and $$N_{t,sys}=\max\{N_{data}-(N_{p1}+N_{p2}),0\}$$

in the non self-decodable case, i.e., s=0.

For $N_{data}>N_{sys}+N_{p1}+N_{p2}$ repetition is performed in the second rate matching stage. A similar repetition rate in all bit streams is achieved by setting the number of transmitted systematic bits to $$N_{t,sys} = N_{sys} + \left\lceil \frac{N_{data} - (N_{sys} + N_{p1} + N_{p2})}{3} \right\rceil.$$

The available room for parity bits in a transmission is:

$$N_{t,p1} = \left\lfloor \frac{N_{data} - N_{t,sys}}{2} \right\rfloor \text{ and } N_{t,p2} = \left\lceil \frac{N_{data} - N_{t,sys}}{2} \right\rceil$$

for the parity 1 and parity 2 bits, respectively.

Table 1 summarizes the resulting parameter choice for the second rate matching stage 318. The parameter a in Table 1 is chosen such that a=2 for parity 1 and a=1 for parity 2.

TABLE 1

Parameters for Second Rate Matching Stage

|  | $X_i$ | $e_{plus}$ | $e_{minus}$ |
|---|---|---|---|
| Systematic RM S | $N_{sys}$ | $N_{sys}$ | $|N_{sys} - N_{t,sys}|$ |
| Parity 1 RM P1_2 | $N_{p1}$ | $a \cdot N_{p1}$ | $a \cdot |N_{p1} - N_{t,p1}|$ |
| Parity 2 RM P2_2 | $N_{p2}$ | $a \cdot N_{p2}$ | $a \cdot |N_{p2} - N_{t,p2}|$ | where $N_{sys}$ is the number of systematic bits, $N_{p1}$ is the number of parity 1 bits, $N_{p2}$ is the number of parity 2 bits, $N_{t,sys}$ is the number of transmitted systematic bits, $N_{t,p1}$ is the number of transmitted parity 1 bits, and $N_{t,p2}$ is the number of transmitted parity 2 bits.

In the prior art, the rate matching parameter $e_{ini}$ is calculated for each bit stream according to the $e_{ini}$ variation parameter r, $r \in \{0,1\}$ using $$e_{ini}(r)=\{[X_i-r \cdot e_{minus}-1] \bmod e_{plus}\}+1$$

in the case of puncturing, i.e., $N_{data} \leq N_{sys}+N_{p1}+N_{p2}$, and $$e_{ini}(r)=\{[X_i-(2 \cdot s+r) \cdot e_{minus}-1] \bmod e_{plus}\}+1$$

for repetition, i.e., $N_{data}>N_{sys}+N_{p1}+N_{p2}$. While varying r does result in mutually orthogonal puncturing patterns, their composite does not result in a uniformly patterned puncturing scheme as shown in the example of FIG. 5. In the scenario shown in FIG. 5, both transmissions are self-decodable with the Parity 1 codeword bits of the first transmission consisting of the $4^{th}$, $10^{th}$, $16^{th}$, ... trellis sections and those of the second transmission consisting of the $3^{rd}$, $9^{th}$, $15^{th}$, ... sections. The IR combined trellis based on the first two transmissions is therefore concerned with the $3^{rd}$, $4^{th}$, $9^{th}$, $10^{th}$, $15^{th}$, $16^{th}$, ... stages in the trellis. In practice, this non-uniform grouping of punctured and unpunctured bits results in a higher FER.

In contrast, in the present invention, $e_{ini}$ is calculated for each bit stream according to the ei, variation parameter r, $r \in \{0,1\}$, using $$e_{ini}(r)=\{[X_i-(r \cdot e_{plus}/2)-1] \bmod e_{plus}\}+1$$

in the case of puncturing, i.e., $N_{data} \leq N_{sys}+N_{p1}$ 30 $N_{p2}$, and $$e_{ini}(r)=\{[X_i-((s+2 \cdot r) \cdot e_{plus}/4)-1] \bmod e_{plus}\}+1$$

for repetition, i.e., $N_{data}>N_{sys}+N_{p1}+N_{p2}$.

In its more general form where $r \in \{0, \ldots, r_{max}-1\}$ and $r_{max}$ is the total number of redundancy versions allowed by varying r, then $e_{ini}$ is calculated for each bit stream according to the $e_{ini}$ variation parameter r, $r \in \{0, \ldots, r_{max}-1\}$, using $$e_{ini}(r)=\{[X_i-(r \cdot e_{plus}/r_{max})-1] \bmod e_{plus}\}+1$$

in the case of puncturing and/or repetition, and $$e_{ini}(r)=\{[X_i-((s+2 \cdot r) \cdot e_{plus}/(2 \cdot r_{max}))-1] \bmod e_{plus}\}+1$$

also in the case of puncturing and/or repetition. In other words, the rate matching equations can be chooses such that either one of the equations is used to rate match for both the case of puncturing (i.e., $N_{data} \leq N_{sys}+N_{p1}+N_{p2}$) and the case of repetition (i.e., $N_{data}>N_{sys}+N_{p1}+N_{p2}$), or one of the equations is chosen to rate match for puncturing and the other equation to rate matching for repetition.

The resulting puncturing pattern both retains orthogonality between redundancy versions of the same s value, but is now uniformly spaced throughout the composite IR combined trellis as shown in the example of parity trellises of FIG. 6, which results in improved FER over that of the trellis of FIG. 5. The invention is applicable to both parity bits and systematic bits.

FIG. 7 shows the improvement provided improved puncturing technique of the present invention. Both the prior art and proposed rate-matching $e_{ini}$ variation schemes were simulated, using known techniques, over an additive white Gaussian noise (AWGN) channel using BPSK modulation with a codeword length of 960 and Ninfo=720, and using two transmission. Curves 60 and 62 represent the FER for the prior art puncturing method after first and second transmissions, respectively. Curves 64 and 66 represent the FER for the puncturing method of the present invention after first and second transmissions, respectively. As can be seen from the simulation results, there is about a 0.2–0.3 dB improvement in FER performance of the present invention over the prior art after two transmissions. In view of the above, the present invention provides a useful improvement over the prior art with no increase in complexity.

In a preferred embodiment, the present invention also provides a method and apparatus to select optimized s and r parameters based on the redundancy scheme chosen (Chase, Partial IR, or Full IR), referring back to redundancy version selector 309 of FIG. 3. The selection of the redundancy version depends on the redundancy scheme being utilized. Currently, three schemes are expected to be support in HSDPA: Chase, Partial Incremental Redundancy (IR) and Full IR. For each redundancy scheme the following methods are used for calculating $s, s \in \{0,1\}$ and $r, r \in \{0,1,2, \ldots, r_{max}-1\}$.

If the Chase redundancy scheme is used, s=1 and r=1 for all transmissions.

If a Partial IR redundancy scheme is used, a first step includes calculating the possible number of unique redundancy versions as $$r_N = \left\lceil \frac{\sum_{i=1}^{P} N_{p\_i}}{\sum_{i=1}^{P} N_{t\_p\_i}} \right\rceil$$

where $N_{p\_i}$ represents the number of parity bits at the output of the turbo encoder from the $i^{th}$ parity stream, $N_{t\_p\_i}$ represents the number of parity bits to be transmitted from the $i^{th}$ parity stream, and P is the number of parity streams. Also, if $r_N > r_{max}$ then $r_N = r_{max}$. In a next step, for transmission index, n, from 1,2, ..., $r_N$, set s=1 and r=n-1. If n>$r_N$, reset n to 1 and repeat the previous step.

If a Full IR redundancy scheme is used, a first step includes calculating the possible number of unique redundancy versions as $$r_N = \min_k \left[ \frac{1}{R} \times k = \frac{1}{BR} \times i \right]$$

where BR is the base code rate, R is the transmit code rate, and k and i are positive integers. Note that k and i are chosen such that exactly k transmissions will equal i output blocks (systematic and parity) from the turbo encoder. Also, if $r_N > r_{max}$ then $r_N = r_{max}$. In a next parameter setting step, for transmission index n=1, set s=1, r=0, and $N_t = N_{trans}$, or for transmission index n from 2, ..., $r_N$, repeat the remaining substeps of: a) a first substep sets $N_t = N_t + N_{trans}$, b) in a next substep, if $$\left( N_t \geq \frac{1}{BR} \times N_{sys} \right)$$

then set flag=1 and $$\left( N_t = N_t - \frac{1}{BR} \times N_{sys} \right)$$

where $N_{sys}$ is the number of systematic bits generated by the turbo encoder. Otherwise set flag=0, c) in a next substep, if $((N_t \geq N_{sys})$ & (flag=1)) then set s=1. Otherwise set s=0, d) in a next sub step set r=r+1, e) in a next substep, if n>$r_N$, reset n to 1 and repeat parameter setting step.

The above schemes automatically select the self-decodable parameter (s) and the redundancy version (r) for the Incremental Redundancy scheme adopted by 3GPP. The values are chosen based on the pre-selected redundancy scheme, which includes Chase, Partial IR, and Full IR, and can be used in conjunction with any adaptive modulation and coding scheme (AMCS) assuming synchronization between the Node B and UE. Otherwise the (s) and (r) parameters can be transmitted to the UE using one of the following two schemes, a) explicitly specifying the value of "s" and "r" and transmitting these values using the High Speed Shared Control Channel (HS-SCCH) or (b) setting up a table of "s" and "r" values and communicating the table at call initiation to UE through higher level signaling. The specific entry in the table is then signaled over the HS-SCCH at each transmission.

In a separate embodiment, where $r_{max}$ is not necessarily known then $e_{ini}$ can be defined as follows $$e_{ini}(r) = \{[X_i - (f(r) \cdot e_{plus}) - 1] \bmod e_{plus}\} + 1$$

where $$f(r) = \text{bin2dec}(\text{flip1r}(\text{dec2bin}(r-1)))/2^{\lceil \log_2(r) \rceil}$$

where "bin2dec" denotes binary to decimal conversion, "dec2bin" denotes decimal to binary conversion, and "flip1r" denotes bit order reversal of the binary sequence.

In a preferred embodiment, the present invention provides a bit priority mapper (311 referring back to FIG. 3) coupled to the rate matching block. The bit priority mapper is for mapping to systematic bits to position of higher reliability in the modulation constellation, which further improves the performance of IR. Bit priority mapping (BPM) is based on utilizing the differing bit reliability offered by higher order constellations (16-QAM or higher). It is well known that systematic portions of a turbo codeword are of greater importance to decoder performance than the parity portions. It naturally follows that system performance can be further improved by placing systematic bits in positions of high reliability if a higher order constellation is used. To achieve this a simple interleaver (reference 311 in FIG. 3) of size $N_{row} \times N_{col}$ is used. The numbers of rows and columns are determined from:

$$N_{row} = \log_2(M)$$

$$N_{col} = N_{trans}/N_{row}$$

where M is the modulation size (constellation order) and $N_{trans}$ is the number of coded and rate-matched bits to be transmitted. For example, $N_{row} = \log_2(16) = 4$ in the case of 16-QAM. In the general turbo encoder case a codeword is separated into a systematic stream and parity streams denoted by $x_{S,k}, p_{1,k}, p_{2,k}$ where $k \in \{1, \ldots, N_{trans}\}$, or in the preferred case a systematic stream and combined parity stream denoted by $x_{S,k}$ and $x_{P,k}$ (see FIG. 1). Data is read into the interleaver row by row, and out of the interleaver column by column. To perform priority mapping, the whole stream of systematic bits from the turbo encoder is read in first (code block-wise and then from left-to-right), followed by combined alternating bits from the two parity streams. Systematic codeword bits 700 are read code block-wise and then from left-to-right into the BPM array. Once all systematic codeword bits have been read in, the combined alternating bits from the two parity streams are read in, continuing from where the systematic codeword bits left off, again code block-wise and then from left-to-right. In the case of full IR where no systematic bits form part of the transmission codeword, only parity codeword bits fill up the array. The BPM array is a sequence of QAM symbols or bit vectors (a vector of four bits in the case of 16-QAM and a vector of two bits in the case of QPSK) given by the columns of the BPM array, read in sequence from left-to-right. Advantageously, this results in systematic bits being mapped into the first rows of the bit mapper followed by subsequent mapping of parity bits.

Interleaving is determined in the same manner as the turbo code internal interleavers, such as is described in section 4.2.3.2.3.1 of "Technical Specification Group Radio Access Network; Multiplexing and Channel Coding (FDD) (Release 1999)", TS 25.212 v3.5.0 (2000-12), which is hereby incorporated by reference.

The symbol mapping is dependent on the type of modulation and the number of systematic and parity bits used in transmission. As an example, if an effective code rate of 3/4 and 16-QAM modulation is used, each QAM symbol comprises of three systematic bits and one parity bit, while if the same version is used with a code rate of 1/2 and 16-QAM modulation, each QAM symbol then comprises of two systematic and two parity bits. FIG. 8 illustrates the bit distribution process for 16-QAM and rate 1/2, where S represents systematic bits and P represents parity bits.

In practice, the interleaver of the present invention is a symbol block interleaver of size 16×30. The interleaving operation proceeds by reading the input symbol sequence $\{y_{p,i}\}$ into the interleaver row by row starting with column 0 of row 0 and continuing on to column 30 of row 16, as shown in FIG. 9. The next step includes performing inter-column permutation using the following permutation pattern {0, 20, 10, 5, 15, 25, 3, 13, 23, 8, 18, 28, 1, 11, 21, 6, 16, 26, 4, 14, 24, 19, 9, 29, 12, 2, 7, 22, 27, 17}, which provides a more homogenous and therefore desirable distribution. In permuting the columns, it is ensured that no sub-block section of the trellis is neglected when only a portion of a row is read out to form the transmitted codeword. The last step is reading the output symbols, column by column.

Referring back to FIG. 3, the physical channel segmentation 312 proceeds according to the 3GPP protocol of section 4.2.10 of TS 25.212, incorporated by reference, but with a modification. Instead of applying the algorithm on bits as in section 4.2.10, it is applied on the QAM symbols/bit vectors output from the BPM described above.

Following channel segmentation 312, (second) interleaving 314, as described in section 4.2.11 in TS 25.212 is applied, again with a modification. In this case, instead of applying the interleaver on the bits comprising each physical channel, it is applied on the QAM symbols values or symbol indices of each of the physical channel which are output from the physical channel segmentation 312.

Finally and similarly, the physical channel mapping 314 described in section 4.2.12 of TS 25.212 is applied, again with substitution of QAM data symbols for bits.

Figure 10:
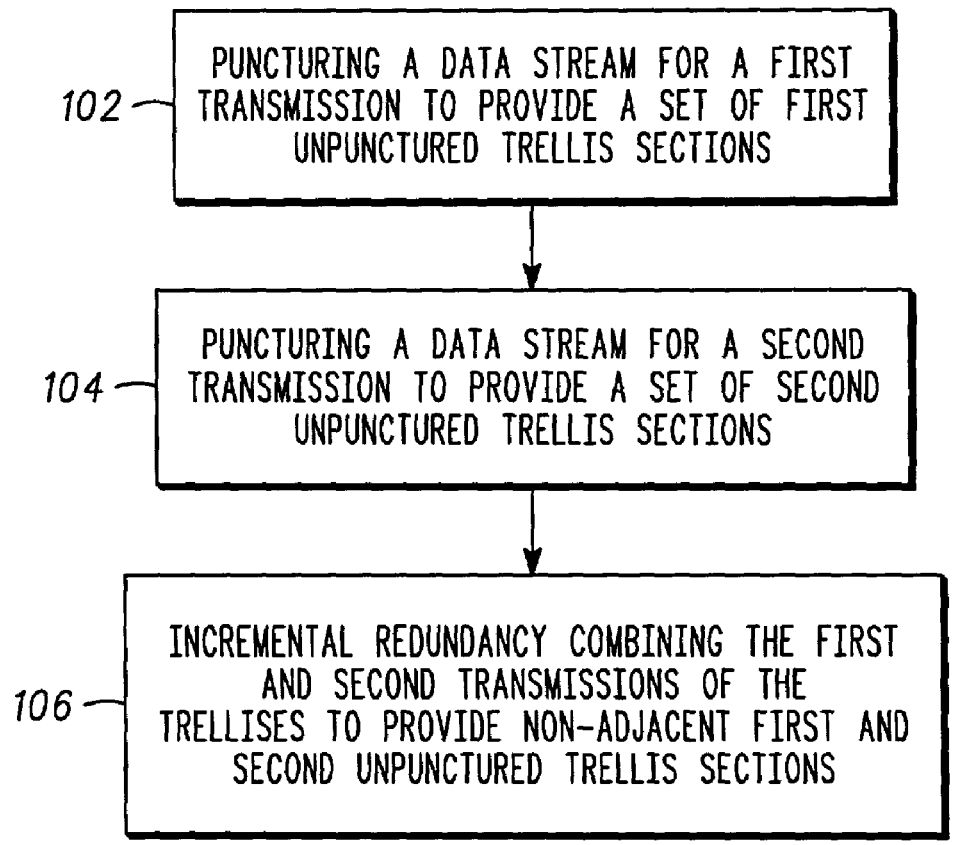
FIG. 10 shows a simplified flow chart of a method, in accordance with the present invention.

FIG. 10 shows a flow chart summarizing the method 100 of improved puncturing for turbo code based incremental redundancy, in accordance with the present invention. A first step 102 of the method includes puncturing a data stream for a first transmission to provide a set of first unpunctured trellis sections. A next step 104 includes puncturing a data stream for a second transmission to provide a set of second unpunctured trellis sections. This can be applied to parity and systematic bits. A next step 106 includes incremental redundancy combining the first and second transmissions of the trellises to provide non-adjacent first and second unpunctured trellis sections. Preferably, this provides uniformly patterned punctured and unpunctured trellis sections in the combined trellis. A next step includes outputting the transmissions of the turbo code, for decoding in a turbo decoder, to obtain the information contained within the turbo code, and providing the information to a user over a user interface such as a speaker, display, and the like, or for storage in a data storage device.

Although the invention has been described and illustrated in the above description and drawings, it is understood that this description is by way of example only and that numerous changes and modifications can me made by those skilled in the art without departing from the broad scope of the invention. Although the present invention finds particular use in portable cellular radiotelephones, the invention could be applied to any two-way wireless communication device, including pagers, electronic organizers, and computers. Applicants' invention should be limited only by the following claims.

What is claimed is:

1. A method for improving turbo code based incremental redundancy, the method comprising the steps of:
puncturing a data stream for a first transmission to provide a set of first unpunctured trellis sections;
puncturing a data stream for a second transmission to provide a set of second unpunctured trellis sections; and
incremental redundancy combining the first and second transmissions of the trellises to provide non-adjacent first and second unpunctured trellis sections,
wherein the puncturing steps each include a substep of rate matching each bit stream using a rate matching parameter defined by the equations $$e_{ini}(r)=\{[X_i-(r \cdot e_{plus}/r_{max})-1] \bmod e_{plus}\}+1$$

and $$e_{ini}(r)=\{[X_i-((s+2 \cdot r) \cdot e_{plus}/(2 \cdot r_{max}))-1] \bmod e_{plus}\}+1$$

where $r \in \{0, \ldots, r_{max}-1\}$ and $r_{max}$ is the total number of redundancy versions allowed by varying r, wherein $e_{ini}$ is calculated for each bit stream according to the $e_{ini}$ variation parameter r, s is 0 or 1 depending on whether the transmission is non-self-decodable or self-decodable, respectively, $e_{plus}$, and $e_{minus}$ are chosen according to the table

| | $X_i$ | $e_{plus}$ | $e_{minus}$ |
|---|---|---|---|
| Systematic RM S | $N_{sys}$ | $N_{sys}$ | $\|N_{sys} - N_{t,sys}\|$ |
| Parity 1 RM P1_2 | $N_{p1}$ | $a \cdot N_{p1}$ | $a \cdot \|N_{p1} - N_{t,p1}\|$ |
| Parity 2 RM P2_2 | $N_{p2}$ | $a \cdot N_{p2}$ | $a \cdot \|N_{p2} - N_{t,p2}\|$ | where a=2 for parity 1 and a=1 for parity 2, $N_{sys}$ is the number of systematic bits, $N_{p1}$ is the number of parity 1 bits, $N_{p2}$ is the number of parity 2 bits, $N_{t,sys}$ is the number of transmitted systematic bits, $N_{t,p1}$ is the number of transmitted parity 1 bits, and $N_{t,p2}$ is the number of transmitted parity 2 bits, and wherein rate matching equations are selected from one of the group consisting of: choosing either one of the equations to rate match for both the case of puncturing (i.e., $N_{data} \leq N_{sys}+N_{p1}+N_{p2}$) and the case of repetition (i.e., $N_{data} > N_{sys}+N_{p1}+N_{p2}$), and choosing one of the equations to rate match for puncturing and the other equation to rate matching for repetition.

2. The method of claim 1, wherein the combining step provides a composite puncturing pattern that is uniformly patterned with unpunctured trellis sections.

3. The method of claim 1, wherein the puncturing steps each provide a set of respective first and second orthogonal unpunctured trellis sections.

4. The method of claim 1, further comprising a step of selecting a redundancy scheme, wherein:
if Chase redundancy is chosen, setting s=1 and r=1 for all transmissions;
if a partial IR redundancy is chosen, performing the substeps of:
calculating the possible number of unique redundancy versions as $$r_N = \left\lceil \frac{\sum_{i=1}^{P} N_{p\_i}}{\sum_{i=1}^{P} N_{t\_p\_i}} \right\rceil$$

where $N_{p\_i}$ represents the number of parity bits at the output of the turbo encoder from the $i^{th}$ parity stream, $N_{t\_p\_i}$ represents the number of parity bits to be transmitted from the $i^{th}$ parity stream, and P is the number of parity streams, wherein if $r_N > r_{max}$ then $r_N = r_{max}$; and for transmission index n, from 1,2, ..., $r_N$, setting s=1 and r=n−1, and wherein if n>$r_N$, resetting n to 1 and repeating this substep; and if a full IR redundancy is chosen, performing the substeps of:
a) calculating the possible number of unique redundancy versions as $$r_N = \min_k \left[\frac{1}{R} \times k = \frac{1}{BR} \times i\right]$$

where BR is the base code rate, R is the transmit code rate, and k and i are positive integers chosen such that exactly k transmissions equal i systematic and parity output blocks, wherein if $r_N > r_{max}$ then $r_N = r_{max}$;

b) for transmission index n=1, setting s=1, r=0, and $N_t = N_{trans}$, and c) for transmission index n from 2, ..., $r_N$, repeating the substeps of:
 setting $N_t = N_t + N_{trans}$;
 setting flag=0;
 if $$\left(N_t \geq \frac{1}{BR} \times N_{sys}\right)$$

then setting flag=1 and $$\left(N_t = N_t - \frac{1}{BR} \times N_{sys}\right)$$

where $N_{sys}$ is the number of systematic bits generated by the turbo encoder;
setting s=0;
if (($N_t \geq N_{sys}$) & (flag=1)) then setting s−1;
setting r=r+1; and
if n>$r_N$, resetting n to 1 and repeating step b).

5. The method of claim 1, further comprising the step of bit priority mapping of systematic bits to position of higher reliability in a modulation constellation.

6. The method of claim 5, wherein the mapping step includes providing an interleaver of size $N_{row} \times N_{col}$, where $N_{row} = \log_2(M)$ and $N_{col} = N_{trans}/N_{row}$, where M is the modulation size and $N_{trans}$ is the number of coded and rate-matched bits to be transmitted and the upper rows of the array have a higher priority than the lower rows of the array, and wherein data is read into the interleaver row by row starting in the topmost row, filling the interleaver with all the systematic bits first, followed by the parity bits, and reading data out of the interleaver column by column.

7. The method of claim 6, wherein the interleaver is of size 16×30, and wherein the mapping step includes performing inter-column permutation using the following permutation pattern {0, 20, 10, 5, 15, 25, 3, 13, 23, 8, 18, 28, 1, 11, 21, 6, 16, 26, 4, 14, 24, 19, 9, 29, 12, 2, 7, 22, 27, 17}.

8. The method of claim 1, further comprising the step of transmitting a set of parameters governing a selected incremental redundancy version sequence operable in the puncturing steps, the transmitting step including one of the group consisting of: explicitly specifying the redundancy version parameters and transmitting these parameters using a control channel, and initially transmitting a table of redundancy version parameters and then selecting a table entry as a means of identifying the redundancy version parameters.

9. A method for improving turbo code based incremental redundancy, the method comprising the steps of:
 puncturing a data stream for a first transmission to provide an orthogonal set of first unpunctured trellis sections;
 puncturing a data stream for a second transmission to provide an orthogonal set of second unpunctured trellis sections; and
 incremental redundancy combining the first and second transmissions of the trellises to provide uniformly patterned and non-adjacent first and second unpunctured trellis sections,
 wherein the puncturing steps each include a substep of rate matching each bit stream using a rate matching parameter defined by the equations $$e_{ini}(r) = \{[X_i - (r \cdot e_{plus}/2) - 1] \bmod e_{plus}\} + 1$$

in the case of puncturing, i.e., $N_{data} \leq N_{sys} + N_{p1} + N_{p2}$, and $$e_{ini}(r) = \{[X_i - ((2 \cdot s + r) \cdot e_{plus}/4) - 1] \bmod e_{plus}\} + 1$$

for repetition, i.e., $N_{data} > N_{sys} + N_{p1} + N_{p2}$, where r is the $e_{ini}$ variation parameter, s is 0 or 1 depending on whether the transmission is non-self-decodable or self-decodable, respectively, and r ranges from 0 to $r_{max}$ to vary the initial error variable $e_{ini}$, and $X_i$, $e_{plus}$, and $e_{minus}$ are chosen according to the table

|  | $X_i$ | $e_{plus}$ | $e_{minus}$ |
|---|---|---|---|
| Systematic RM S | $N_{sys}$ | $N_{sys}$ | $|N_{sys} - N_{t,sys}|$ |
| Parity 1 RM P1_2 | $N_{p1}$ | $a \cdot N_{p1}$ | $a \cdot |N_{p1} - N_{t,p1}|$ |
| Parity 2 RM P2_2 | $N_{p2}$ | $a \cdot N_{p2}$ | $a \cdot |N_{p2} - N_{t,p2}|$ | where a=2 for parity 1 and a=1 for parity 2, $N_{sys}$ is the number of systematic bits, $N_{p1}$ is the number of parity 1 bits, $N_{p2}$ is the number of parity 2 bits, $N_{t,sys}$ is the number of transmitted systematic bits, $N_{t,p1}$ is the number of transmitted parity 1 bits, and $N_{t,p2}$ is the number of transmitted parity 2 bits.

10. The method of claim 9, further comprising a step of determining incremental redundancy parameters s and r, where s is a self-decoding variable and r is a redundancy version, the determining step includes selecting a redundancy scheme, wherein:
 if Chase redundancy is chosen, setting s=1 and r=1 for all transmissions;

if a partial IR redundancy is chosen, performing the substeps of:
  calculating the possible number of unique redundancy versions as $$r_N = \left\lfloor \frac{\sum_{i=1}^{P} N_{p\_i}}{\sum_{i=1}^{P} N_{t\_p\_i}} \right\rfloor$$

where $N_{p\_i}$ represents the number of parity bits at the output of the turbo encoder from the $i^{th}$ parity stream, $N_{t\_p_B\_i}$ represents the number of parity bits to be transmitted from the $i^{th}$ parity stream, and P is the number of parity streams, wherein if $r_N > r_{max}$ then $r_N = r_{max}$; and for transmission index n, from 1,2, ..., $r_N$, setting s=1 and r=n−1, and wherein if n>$r_N$, resetting n to 1 and repeating this substep; and if a full IR redundancy is chosen, performing the substeps of:
  a) calculating the possible number of unique redundancy versions as $$r_N = \min_k \left[ \frac{1}{R} \times k = \frac{1}{BR} \times i \right]$$

where BR is the base code rate, R is the transmit code rate, and k and i are positive integers chosen such that exactly k transmissions equal i systematic and parity output blocks, wherein if $r_N > r_{max}$ then $r_N = r_{max}$;
  b) for transmission index n=1, setting s=1, r=0, and $N_1 = N_{trans}$, and
  c) for transmission index n from 2, ..., $r_N$, repeating the substeps of:
    setting $N_t = N_t + N_{trans}$;
    setting flag=0;
    if $$\left( N_t \geq \frac{1}{BR} \times N_{sys} \right)$$

then setting flag=1 and $$\left( N_t = N_t - \frac{1}{BR} \times N_{sys} \right)$$

where $N_{sys}$ is the number of systematic bits generated by the turbo encoder;
    setting s=0;
    if $((N_t \geq N_{sys})$ & (flag=1)) then setting s+1;
    setting r=r+1; and
    if n>$r_N$, resetting n to 1 and repeating step b).

11. The method of claim 9, further comprising the step of bit priority mapping of systematic bits to position of higher reliability in a modulation constellation, wherein the mapping step includes providing an interleaver of size $N_{row} \times N_{col}$, where $N_{row} = \log_2(M)$ and $N_{col} = N_{trans}/N_{row}$, where M is the modulation size and $N_{trans}$ is the number of coded and rate-matched bits to be transmitted and the upper rows of the array have a higher priority than the lower rows of the array, and wherein data is read into the interleaver row by row starting in the topmost row, filling the interleaver with all the systematic bits first, followed by the parity bits, and reading data out of the interleaver column by column.

12. The method of claim 11, wherein the interleaver is of size 16×30, and wherein the mapping step includes performing inter-column permutation using the following permutation pattern {0, 20, 10, 5, 15, 25, 3, 13, 23, 8, 18, 28, 1, 11, 21, 6, 16, 26, 4, 14, 24, 19, 9, 29, 12, 2, 7, 22, 27, 17}.

13. A turbo coder with improved incremental redundancy, comprising:
  a channel coder operable to code an input data stream into systematic bits and parity bits;
  a rate matching block coupled to the channel coder that matches the number of bits at the output of the channel coder to the total number of bits of available HS-DSCH physical channels, the rate matching block punctures a data stream for a first transmission to provide a set of first unpunctured trellis sections and punctures a data stream for a second transmission to provide a set of second unpunctured trellis sections; and
  a redundancy version selector coupled to the rate matching block, the redundancy version selector providing rate-matching parameters to the rate matching block, wherein the rate matching block provides incremental redundancy to combine the first and second transmissions of the trellises to provide non-adjacent first and second unpunctured trellis sections,
  wherein the rate matching parameters are defined by the equations $$e_{ini}(r) = \{[X_i - (r \cdot e_{plus}/2) - 1] \bmod e_{plus}\} + 1$$

in the case of puncturing, i.e., $N_{data} \leq N_{sys} + N_{p1} + N_{p2}$, and $$e_{ini}(r) = \{[X_i - ((2 \cdot s + r) \cdot e_{plus}/4) - 1] \bmod e_{plus}\} + 1$$

for repetition, i.e., $N_{data} > N_{sys} + N_{p1} + N_{p2}$, where r is the $e_{ini}$ variation parameter, s is 0 or 1 depending on whether the transmission is non-self-decodable or self-decodable, respectively, and r ranges from 0 to $r_{max}$ to vary the initial error variable $e_{ini}$, and $X_i$, $e_{plus}$, and $e_{minus}$ are chosen according to the table

|  | $X_i$ | $e_{plus}$ | $e_{minus}$ |
|---|---|---|---|
| Systematic RM S | $N_{sys}$ | $N_{sys}$ | $|N_{sys} - N_{t,sys}|$ |
| Parity 1 RM P1_2 | $N_{p1}$ | $a \cdot N_{p1}$ | $a \cdot |N_{p1} - N_{t,p1}|$ |
| Parity 2 RM P2_2 | $N_{p2}$ | $a \cdot N_{p2}$ | $a \cdot |N_{p2} - N_{t,p2}|$ | where a=2 for parity 1 and a=1 for parity 2, $N_{sys}$ is the number of systematic bits, $N_{p1}$ is the number of parity 1 bits, $N_{p2}$ is the number of parity 2 bits, $N_{t,sys}$ is the number of transmitted systematic bits, $N_{t,p1}$ is the number of transmitted parity 1 bits, and $N_{t,p2}$ is the number of transmitted parity 2 bits.

14. The coder of claim 13, wherein the rate matching block provides a composite puncturing pattern that is uniformly patterned with unpunctured trellis sections.

15. The coder of claim 13, wherein the redundancy version selector selects a redundancy scheme wherein
  if Chase redundancy is chosen, setting s=1 and r=1 for all transmissions;

if a partial IR redundancy is chosen, performing the substeps of:

calculating the possible number of unique redundancy versions as $$r_N = \left\lceil \frac{\sum_{i=1}^{P} N_{p\_i}}{\sum_{i=1}^{P} N_{t\_p\_i}} \right\rceil$$

where $N_{p\_i}$ represents the number of parity bits at the output of the turbo encoder from the $i^{th}$ parity stream, $N_{t\_p\_i}$ represents the number of parity bits to be transmitted from the $i^{th}$ parity stream, and P is the number of parity streams, wherein if $r_N > r_{max}$ then $r_N = r_{max}$; and for transmission index n, from 1,2, ..., $r_N$, setting s=1 and r=n−1, and wherein if n>$r_N$, resetting n to 1 and repeating this substep; and if a full IR redundancy is chosen, performing the substeps of:

a) calculating the possible number of unique redundancy versions as $$r_N = \min_k \left[ \frac{1}{R} \times k = \frac{1}{BR} \times i \right]$$

where BR is the base code rate, R is the transmit code rate, and k and i are positive integers chosen such that exactly k transmissions equal i systematic and parity output blocks, wherein if $r_N > r_{max}$ then $r_N = r_{max}$;

b) for transmission index n=1, setting s=1, r=0, and $N_t = N_{trans}$, and c) for transmission index n from 2, ..., $r_N$, repeating the substeps of:

setting $N_t = N_t + N_{trans}$;
setting flag=0;
if $$\left( N_t \geq \frac{1}{BR} \times N_{sys} \right)$$

then setting flag=1 and $$\left( N_t = N_t - \frac{1}{BR} \times N_{sys} \right)$$

where $N_{sys}$ is the number of systematic bits generated by the turbo encoder;
setting s=0;
if (($N_t \geq N_{sys}$) & (flag=1)) then setting s=1;
setting r=r+1; and
if n>$r_N$, resetting n to 1 and repeating step b).

16. The coder of claim 13, further comprising:
a bit priority mapper coupled to the rate matching block, the bit priority mapper operable to map systematic bits to positions of higher reliability in a modulation constellation;
a symbol interleaver coupled to the bit priority mapper, the interleaver operable to load the systematic symbols and parity symbols into an array in a row-wise manner.

17. The coder of claim 16, wherein interleaver provides an array of size $N_{row} \times N_{col}$, where $N_{row} = \log_2(M)$ and $N_{col} = N_{trans}/N_{row}$, where M is the modulation size and $N_{trans}$ is the number of coded and rate-matched bits to be transmitted, and the upper rows of the array have a higher priority than the lower rows of the array, and wherein the bit priority mapper provides data into the interleaver row by row starting in the topmost row, filling the interleaver with all the systematic bits first, followed by the parity bits, and wherein the interleaver outputs data column by column.

18. The coder of claim 17, wherein the interleaver is of size 16×30, and wherein the bit mapper performs inter-column permutation using the following permutation pattern {0, 20, 10, 5, 15, 25, 3, 13, 23, 8, 18, 28, 1, 11, 21, 6, 16, 26, 4, 14, 24, 19, 9, 29, 12, 2, 7, 22, 27, 17}.

* * * * *

UNITED STATES PATENT AND TRADEMARK OFFICE
CERTIFICATE OF CORRECTION

PATENT NO. : 7,000,173 B2
DATED : February 14, 2006
INVENTOR(S) : Buckley et al.

It is certified that error appears in the above-identified patent and that said Letters Patent is hereby corrected as shown below:

Column 10,
Line 49, delete "$\leqq$" and replace with -- $\leq$ --.

Column 11,
Line 55, delete "$\leqq$" and replace with -- $\leq$ --.

Column 12,
Line 35, delete "$\leqq$" and replace with -- $\leq$ --.

Column 13,
Line 16, delete "$N_{pR\_i}$" and replace with -- $N_{p\_i}$ --.
Line 37, delete "$N_1$" and replace with -- $N_t$ --.
Line 59, delete "$\leqq$" and replace with -- $\leq$ --; delete "s+1" and replace with -- s=1 --.

Column 14,
Line 35, delete "$\leqq$" and replace with -- $\leq$ --.

Column 16,
Line 16, delete "$\leqq$" and replace with -- $\leq$ --.

Signed and Sealed this

Twenty-third Day of May, 2006

JON W. DUDAS
*Director of the United States Patent and Trademark Office*